United States Patent
Arumugam et al.

(10) Patent No.: US 9,983,266 B2
(45) Date of Patent: May 29, 2018

(54) APPARATUS AND METHODS FOR BATTERY MONITORING USING DISCHARGE PULSE MEASUREMENTS

(71) Applicant: Eaton Corporation, Cleveland, NC (US)

(72) Inventors: Balakrishnan Arumugam, Pune (IN); Mayuresh Arun Shendurnikar, Pune (IN); Arti Dayma, Pune (IN); Hassan Al-Atat, Lakeville, MN (US); Webb L. Burgess, Raleigh, NC (US)

(73) Assignee: Eaton Intelligent Power Limited (IE)

( * ) Notice: Subject to any disclaimer, the term of this patent is extended or adjusted under 35 U.S.C. 154(b) by 228 days.

(21) Appl. No.: 14/672,663

(22) Filed: Mar. 30, 2015

(65) Prior Publication Data

US 2016/0291089 A1    Oct. 6, 2016

(51) Int. Cl.
*H02J 7/00* (2006.01)
*H02J 7/14* (2006.01)
*G01R 31/36* (2006.01)

(52) U.S. Cl.
CPC ..... *G01R 31/3624* (2013.01); *G01R 31/3662* (2013.01); *G01R 31/3648* (2013.01)

(58) Field of Classification Search
USPC ....... 320/132, 134, 139, 136, 124, 129, 137, 320/141, 104, 133, 135, 145, 152, 155,
(Continued)

(56) References Cited

U.S. PATENT DOCUMENTS 5,977,750 A * 11/1999 Ng ................... G01R 19/16542
320/132
6,281,683 B1 * 8/2001 Podrazhansky ...... G01R 31/362
320/132
(Continued)

FOREIGN PATENT DOCUMENTS

DE    10 2011 119005 A1    5/2012
EP         1314990            5/2003
(Continued)

OTHER PUBLICATIONS

International Search Report and Written Opinion Corresponding to International Application No. PCT/US2016/024417; dated Jun. 6, 2016; 11 Pages.

(Continued)

*Primary Examiner* — Alexis Pacheco
(74) *Attorney, Agent, or Firm* — Ward and Smith, P.A.

(57) ABSTRACT

Methods include determining first and second voltages of a battery before and after a load interval, determining a current through the battery during the load interval, and determining a status of the battery from the determined first and second voltages and the determined current. The load interval may include an interval during which a discharge pulse is applied to the battery, and the first and second voltages may be voltages when the battery is open circuited. The first voltage may be determined before the battery transitions from an open-circuited state to a pulse discharge state, and the second voltage may be determined after the battery transitions from the pulse discharge state to the open-circuited state. Corresponding battery monitoring apparatus and computer program products are also described.

14 Claims, 5 Drawing Sheets

(58) Field of Classification Search
USPC ........ 320/157, 159, 164; 324/426, 427, 432, 324/433, 429, 430
See application file for complete search history.

(56) References Cited

U.S. PATENT DOCUMENTS

| | | | |
|---|---|---|---|
| 6,646,419 B1* | 11/2003 | Ying | G01R 31/3668 320/132 |
| 6,861,842 B2 | 3/2005 | Baeuerlein et al. | |
| 6,924,622 B1 | 8/2005 | Anbuky et al. | |
| 7,199,557 B2* | 4/2007 | Anbuky | G01R 31/3651 320/132 |
| 7,405,571 B1 | 7/2008 | Liu | |
| 7,622,929 B2 | 11/2009 | Tinnemeyer et al. | |
| 7,898,263 B2 | 3/2011 | Ishida et al. | |
| 8,269,463 B2 | 9/2012 | Nakashima et al. | |
| 8,283,891 B2 | 10/2012 | Anbari | |
| 2001/0009371 A1 | 7/2001 | Podrazhansky et al. | |
| 2005/0151657 A1 | 7/2005 | Lockhart et al. | |
| 2007/0222418 A1* | 9/2007 | Le Gall | H02J 7/0013 320/136 |
| 2009/0228225 A1 | 9/2009 | Burgess | |
| 2010/0060236 A1* | 3/2010 | Delaille | H01M 10/44 320/134 |
| 2011/0109273 A1* | 5/2011 | Tamezane | H02J 7/0077 320/132 |
| 2011/0285356 A1* | 11/2011 | Maluf | H02J 7/0052 320/139 |
| 2011/0316548 A1* | 12/2011 | Ghantous | G01R 31/3637 324/427 |
| 2015/0051855 A1* | 2/2015 | Joe | G01R 31/362 702/63 |
| 2015/0061687 A1 | 3/2015 | Shim | |
| 2015/0234014 A1* | 8/2015 | Moganty | H01M 10/448 320/136 |
| 2015/0377978 A1 | 12/2015 | Mitsuyama et al. | |
| 2016/0052419 A1* | 2/2016 | Takahashi | H01M 10/48 429/61 |

FOREIGN PATENT DOCUMENTS

| | | |
|---|---|---|
| JP | H11204150 | 7/1999 |
| JP | 2000-067932 A | 3/2000 |
| WO | WO 2005/078673 | 8/2005 |
| WO | WO 2014/136593 A1 | 9/2014 |

OTHER PUBLICATIONS

International Preliminary Report on Patentability; corresponding PCT/US2016/024417; dated Oct. 3, 2017; 5 pages.

* cited by examiner

APPARATUS AND METHODS FOR BATTERY MONITORING USING DISCHARGE PULSE MEASUREMENTS

BACKGROUND

The inventive subject matter relates to electric power systems and methods of operating the same and, more particularly, to battery systems and methods of operating the same.

Uninterruptible power supply (UPS) systems a commonly used in applications such as data centers, where they are used to provide backup power in the event of the failure of a primary utility supply. In such applications, strings of valve-regulated lead-acid (VRLA) batteries are often used.

In such applications, VRLA batteries typically will be left in an idle state for extended periods of time, subject to trickle and/or periodic charging and intermittent testing. As such batteries may degrade over time, they may fail to provide rated voltage and/or current when called upon to provide power. Accordingly, data center operations often include regular battery inspection and maintenance to identify dead batteries or batteries that are perilously close to the end of their useful life. Such preventive maintenance can be time-consuming and expensive.

A variety of prognostic techniques have been developed to identify impending battery failure. Some of these techniques involve monitoring of battery parameters, such as output voltage, and determining battery status from this data. Examples of such techniques are described, for example, in U.S. Pat. No. 6,924,622 to Anbuky et al., U.S. Pat. No. 7,199,557 to Anbuky et al., and U.S. Patent Application Publication No. 2009/0228225 to Burgess.

SUMMARY

Some embodiments of the inventive subject matter provide methods including determining first and second voltages of a battery before and after a load interval, determining a current through the battery during the load interval, and determining a status of the battery from the determined first and second voltages and the determined current. The load interval may include an interval during which a discharge pulse is applied to the battery, and the first and second voltages may be voltages when the battery is open circuited. The first voltage may be determined before the battery transitions from an open-circuited state to a pulse discharge state, and the second voltage may be determined after the battery transitions from the pulse discharge state to the open-circuited state.

According to some embodiments, determining first and second voltages of the battery before and after the load interval includes determining the first voltage under a first load condition. The methods may further include transitioning the battery from the first load condition to a second load condition after determining the first voltage. Determining the current through the battery during the load interval may include determining the current under the second load condition. The methods may further include transitioning the battery from the second load condition to the first load condition. Determining first and second voltages of the battery before and after the load interval further may include determining the second voltage under the first load condition. Substantially more current may be drawn from the battery under the second load condition that under the first load condition. For example, the first load condition may be an open circuit condition and the second load condition may be a pulse discharge condition.

According to further embodiments, determining a status of the battery from the determined first and second voltages and the determined current may include determining a resistance of the battery from the determined first and second voltages and the determined current. For example, determining a resistance of the battery from the determined first and second voltages and the determined current may include a dividing a difference between the determined first and second voltages by the determined current.

According to some embodiments, the battery may be a valve-regulated lead acid (VRLA) battery and the load interval may be an interval of a discharge pulse sufficient to cause the battery to exit an equilibrium state. The discharge pulse may be in a range from about 1 times the ampere-hour rating of the battery to about 15 times the ampere-hour rating of the battery.

Further embodiments of the inventive subject matter provide an apparatus including an input port configured to be coupled to a battery, a load circuit coupled to the input port, configured to selectively couple a load to the input port, and a control circuit coupled to the input port and the load circuit and configured to couple the load to the input for a load interval, to determine first and second voltages at the input port before and after the load interval, and to determine a current through the battery during the load interval. The control circuit may be further configured to determine a status of the battery from the determined first and second voltages and the determined current. For example, the control circuit may be configured to determine a resistance of the battery from the determined first and second voltages and the determined current by dividing a difference between the first and second voltages by the determined current. The control circuit may be further configured to determine a Coup de Fouet characteristic of the battery.

In some embodiments, the load circuit, the current sensor and the control circuit may be combined in a battery monitoring module configured to communicate with an external controller and to operate the load circuit and provide information regarding the determined resistance to the external controller responsive to a control input from the external controller.

In some embodiments, the loading circuit may include a switch configured to selectively couple and decouple first and second terminals of the input port responsive to a switch control signal. The control circuit may include a current sensor configured to be coupled in series with the input port, a voltage sensor coupled in parallel with the input port, an analog to digital converter (ADC) circuit coupled to the current sensor and the voltage sensor, and a processor coupled to the ADC circuit and configured to generate the switch control signal. The current sensor may be coupled in series with the switch. The voltage sensor may include a voltage divider. The control circuit may further include a difference amplifier circuit having a first input coupled to the voltage divider, a second input coupled to a reference voltage source, and an output coupled to an input of the ADC circuit.

DETAILED DESCRIPTION

Figure 1:
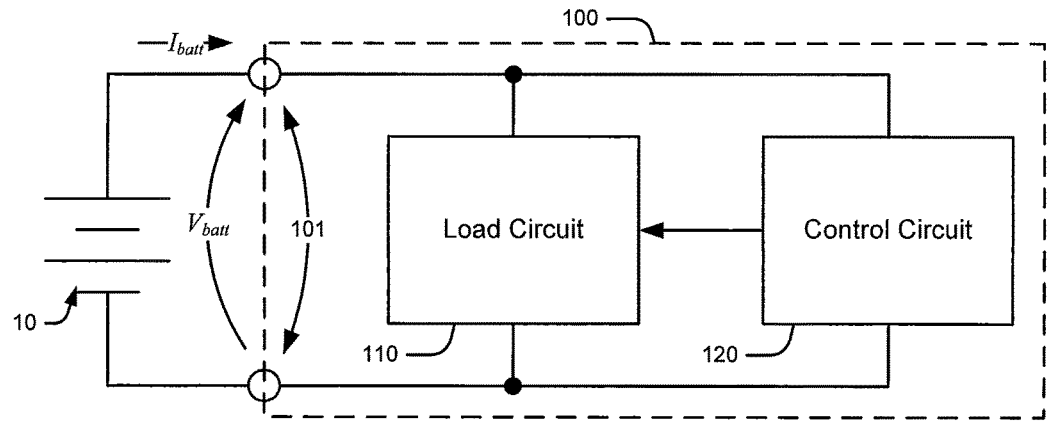
FIG. 1 is a schematic diagram illustrating apparatus and methods for monitoring a battery according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

The inventive subject matter may be embodied as apparatus, methods and computer program products. Some embodiments may be described with reference to block diagrams and/or operational illustrations that illustrate structures and operations. Blocks of the block diagrams and/or operational illustrations may generally implemented using electric circuits configured to perform the specified functions. These "circuits" may generally be implemented using analog and/or digital circuitry. The circuits may include discrete components and/or integrated components, such as data processing integrated circuits (e.g., microprocessors, microcontrollers, digital signal processors and the like) and application-specific integrated circuits (ASICs).

Each block in such diagrams may represent a module, segment, or portion of computer-executable program code for implementing the specified logical function(s). Computer-executable program code may be provided one or more data processors, special purpose processors, ASICs, and/or other programmable data processing apparatus, such that the instructions, which execute to the code to provide the functions/acts specified in the block diagrams and/or operational block or blocks.

These computer-executable program code may also be stored in a non-transitory medium that may direct a controller circuit to function in a particular manner, such that the program code stored in the non-transitory medium constitute an article of manufacture including instructions that implement the functions specified in the block or blocks of the block diagrams and/or operational illustrations. The non-transitory medium may be, but is not limited to, an electronic, magnetic, optical, electromagnetic, or semiconductor system, apparatus, or device. More specific examples (a non-exhaustive list) of the non-transitory medium include the following: hard disk devices, optical storage devices, magnetic storage devices, random access memory (RAM) devices, read-only memory (ROM) devices, erasable programmable read-only memory (EPROM or Flash memory) devices, and compact disc read-only memory (CD-ROM).

Some embodiments of the inventive subject matter provide prognostic battery monitoring apparatus and methods that may use highly accurate but low cost sensor hardware. According to some embodiments, a battery monitoring module may perform multiple types of measurements, including a discharge pulse resistance measurement, Coup de Fouet (CDF) measurements, and voltage measurements during normal discharge states.

According to some embodiments, a discharge pulse resistance test may yield a measurement that may be correlated with a power delivery capability of the battery. In some embodiments, first and second voltages produced by a battery before the start and after a brief discharge pulse, respectively, are measured. A current drawn from the battery during the discharge pulse is also measured. A discharge pulse resistance is determined by dividing a difference between the pre- and post-pulse voltages by the discharge pulse current.

According to some embodiments, the discharge pulse is sufficient to cause the battery to exit an equilibrium state associated with the open-circuited battery. For a VLRA battery, for example, such a discharge pulse may be in a range from about 1 times the ampere-hour rating of the battery to about 15 times the ampere-hour rating of the battery. In some embodiments, the second voltage measurement occurs sufficiently after the discharge pulse such that the battery has reached an equilibrium, i.e., the time between the first and second voltage measurements is longer than the duration of the discharge pulse. Trending of the discharge pulse resistance measurements yielded by a series of such short discharge pulse tests may be correlated to degradation of the battery, e.g., as the battery ages, the values of the discharge pulse resistance measurements increase. Thus, the discharge pulse resistance measurements can provide an indication of remaining capacity, which can be used to guide maintenance and other operations. For example, when the discharge pulse resistance measurements exceed a predetermined value, a user may be notified of a need to replace the battery.

CDF measurements may also correlate to an energy capacity of the battery. In a CDF measurement, voltage is measured during an initial period of a discharge of the battery into a nominal load. A minimum voltage (a "dip" or "trough" voltage) and a plateau voltage (a steady state voltage after the dip voltage) are identified from these voltage measurements. According to some embodiments, an estimate of useful life may be obtained from a combination of short pulse internal resistance measurements and such Coup De Fouet voltage measurements. For example, such measurements may be combined in a weighted model to generate an estimate of remaining battery useful life or similar quantity that can be used to guide battery maintenance and replacement.

According to further embodiments, battery apparatus used to support the predictive operations described above may also be used to identify battery failure. For example, the apparatus may periodically monitor battery voltage and signal when the battery voltage indicates battery failure.

FIG. 1 illustrates a battery monitoring apparatus 100 according to some embodiments. The apparatus 100 includes a port 101 configured to be coupled to a battery 10. A load circuit 110 is coupled to the port 101 and is configured to selectively couple first and second terminals of the port 101 to one another through a relatively low impedance to apply a short discharge pulse to the battery 10, under control of a control signal generated by a control circuit 120. The control circuit 120 is configured to sense the battery voltage $V_{batt}$ at the input port 101 and a current $I_{batt}$ drawn from the battery 10 in conjunction with operation of the load circuit 110. In particular, the control circuit 120 may be configured to control the load circuit 110 and sense voltage and current to perform the discharge pulse resistance, CDF and voltage measurements discussed above.

Figure 2:
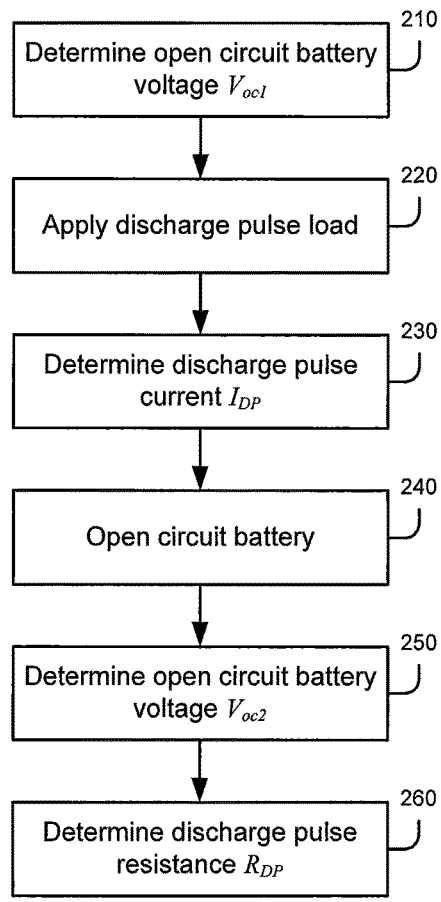
FIGS. 2 and 3 are flowcharts illustrating operations for monitoring a battery according to various embodiments.

FIG. 2 illustrates operations that may be performed by the apparatus of FIG. 1. A first battery voltage $V_{oc1}$ is measured (block 210) with the battery open circuited (i.e., with little or no load coupled to the battery terminals) before performing a short discharge pulse (e.g., coupling the terminals of the battery together through a relatively low impedance) for a brief interval (block 220). As noted above, in some embodiments, the discharge pulse is sufficient to drive the battery out of the open-circuit equilibrium state. It will be appreciated that the discharge pulse may vary depending, for example, on the chemistry and rated capacity of the battery. A current $I_{DP}$ drawn from the battery during the discharge pulse is measured (block 230). After the discharge pulse ends by again open-circuiting the battery (block 240), a second open-circuit battery voltage $V_{oc2}$ is measured (block 250). As noted above, the second open-circuit voltage may be measured at time after the battery reaches an equilibrium state. A discharge pulse resistance $R_{DP}$ is then determined (block 260) according to the following relation:

$$R_{DP}=(V_{oc1}-V_{oc2})/I_{DP}.$$

This quantity may indicate battery status. For example, a series of values of the discharge pulse resistance $R_{DP}$ may be generated over a series of periodic intervals, and the generated values analyzed to identify a trend (e.g., an increase in the resistance $R_{DP}$) that indicates a significantly increased likelihood of failure of the battery.

Figure 3:
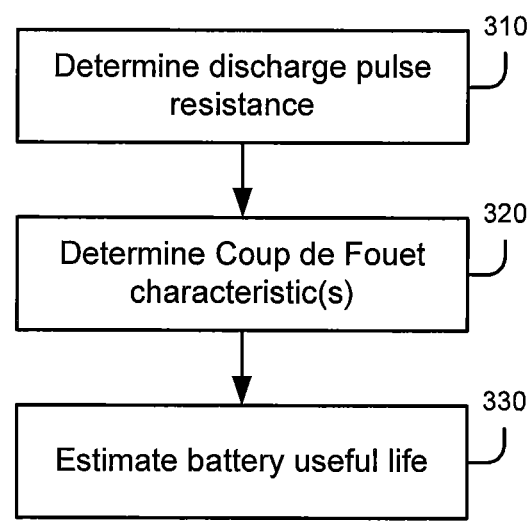

FIG. 3 illustrates operations that may be performed by the apparatus of FIG. 1 according to further embodiments. A discharge pulse resistance is measured as described above with reference to FIG. 2 (block 310). Coup de Fouet characteristics, e.g., plateau and dip voltages, are also determined (block 320). These voltages may be determined prior to or after the discharge pulse resistance measurements, e.g., when a nominal load is coupled to the battery. For example, in a UPS application in which the battery serves as an auxiliary or backup power source, such Coup de Fouet measurements may be made when the UPS transitions to a battery-powered mode and/or may be performed during a scheduled test interval. The discharge pulse resistance and the Coup de Fouet voltages may be used individually and/or in combination, for example, to determine a remaining useful life of the battery (block 330).

Figure 4:
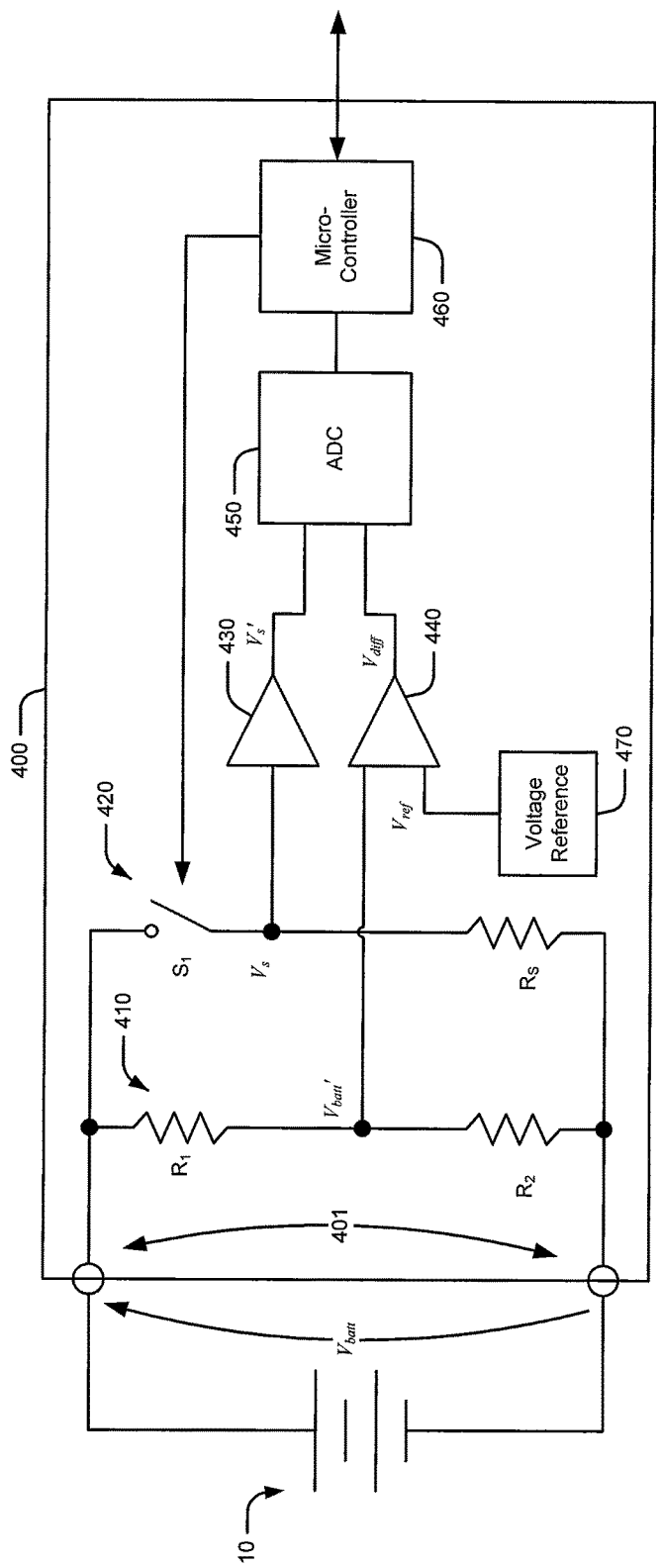
FIG. 4 is a schematic block diagram illustrating a battery monitoring apparatus according to further embodiments.

FIG. 4 illustrates a battery monitoring module 400 that may be used to implement the operations described above. The module 400 includes an input port 401, which is configured to be coupled to terminals of a battery 10. A voltage divider circuit 410 includes first and second resistors $R_1$, $R_2$ and is configured to generate a voltage $V_{batt}'$, corresponding to a scaled version of the voltage $V_{batt}$ produced by the battery 10. A load circuit 420 includes a switch $S_1$ (e.g., a MOSFET-based switch) coupled in series with a current sense resistor $R_s$. A buffer amplifier circuit 430 has an input coupled to the current sense resistor $R_s$ that receives a current sense voltage $V_s$ and produces a buffered current sense voltage $V_s'$ to an input of an analog to digital converter (ADC) circuit 450. A difference amplifier circuit 440 has a first input coupled to the voltage divider circuit 410 and a second input configured to receive a reference voltage $V_{ref}$ from a voltage reference source 470. An output signal $V_{diff}$ produced by the difference amplifier circuit 440, representing a difference between the scaled output voltage $V_{batt}'$ and the reference voltage $V_{ref}$, is also provided to the ADC circuit 450. The ADC circuit 450 generates digital values corresponding to the difference signal $V_{diff}$ and the buffered current sense voltage $V_s'$, and provides the digital values to a microcontroller 460.

The microcontroller 460 is configured to control the switch $S_1$ of the loading circuit 420 and to compute quantities, such as the discharge pulse resistance and Coup de Fouet parameters discussed above, from voltage and current information received via the ADC circuit 450. The microcontroller 460 is configured to communicate with an external controller using, for example, a wireless or wired communications link. As shown, the microcontroller 460 may communicate battery information, such as discharge pulse resistance, Coup de Fouet parameters, and the like, to the external controller to enable, for example, determination of current battery status and to perform predictive operations, such as prediction of impending battery failure.

According to some embodiments, the module 400 may be capable of performing precise measurements that may be needed for accurate determination of the discharge pulse resistance and Coup de Fouet parameters. For example, the ADC circuit 450 may be a high-speed 16-bit converter, such as the Texas Instruments ADS8327 low power, 16-bit, 500-kSPS ADC. This, coupled with the use of the difference amplifier circuit 440, which generates an output relative to a reference voltage (e.g., 4.096 V for a 12-volt battery), allows discrimination of relatively small difference in voltages to support accurate determination of the discharge pulse resistance, wherein a difference between the pre-pulse open circuit voltage and the post-pulse open circuit voltage may be on the order of a few hundred millivolts. In particular, the use of the difference amplifier allows an upper range of battery voltage values to be mapped to the range of the ADC, further enhancing the resolution afforded by the ADC.

As discussed above, the microcontroller 460 may include communications circuitry that enables communication with an external device. The microcontroller 460 may be, for example, a highly integrated system-on-chip (SoC) device, such as the Texas Instruments CC430F5137 16-bit Ultra-Low-Power MCU. Such a microcontroller device may include integrated radio communications capabilities that allow the microcontroller 460 to wirelessly communicate with an external device to allow the module to be commanded to perform certain measurements, such as the discharge pulse resistance and Coup de Fouet measurements discussed above, and to convey data pertaining to such measurements to the external device for further processing.

Figure 5:
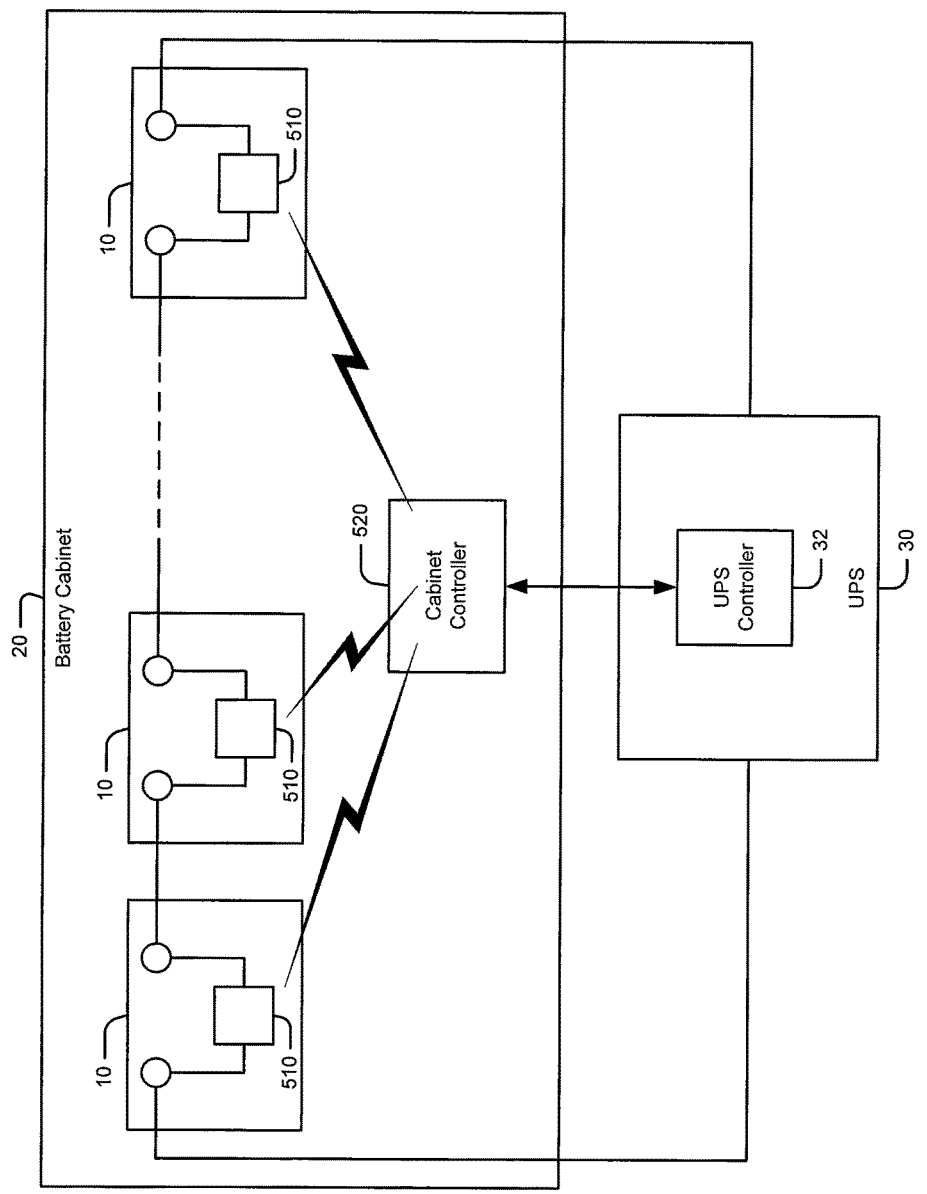
FIG. 5 illustrates a UPS system including a battery cabinet with wireless battery monitoring apparatus according to some embodiments.

FIG. 5 illustrates an exemplary use of such a battery monitoring module in a UPS application. A UPS system includes a battery cabinet 20 including a string of batteries 10 coupled to a UPS 30. Respective battery monitoring modules 510 are coupled to terminals of respective ones of the batteries 10. The battery modules 510 wirelessly communicate with a controller 520, also positioned in the battery cabinet 20. The controller 520 is configured to communicate with a UPS controller 32. This arrangement may be used to implement various ones of the battery monitoring operations discussed above.

Figure 6:
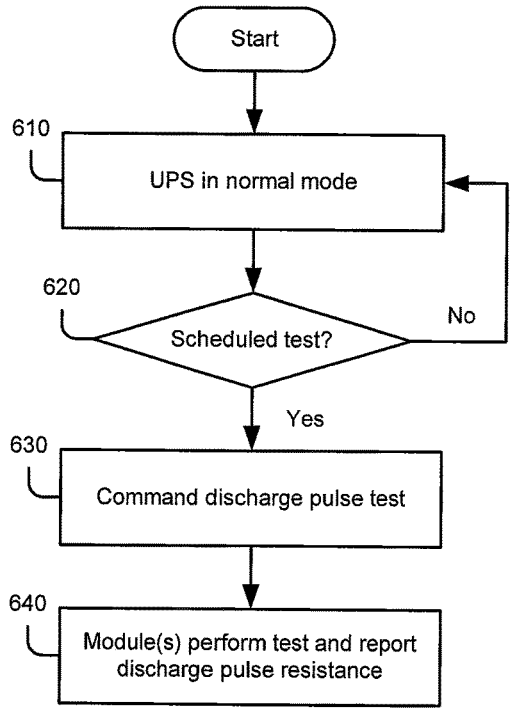
FIGS. 6 and 7 are flowcharts illustrating operations of the system of FIG. 5 according to further embodiments.

FIG. 6 illustrates operations for generating discharge pulse resistance measurements using the apparatus illustrated in FIG. 5. While the UPS 30 is operating in normal mode wherein the UPS 30 is providing power to a load from a primary power source (e.g., a utility source) with the string of batteries 10 unloaded (block 610), the UPS controller 32 and/or the battery cabinet controller 520 detects that a time for a scheduled test has arrived, and commands the battery monitoring modules 10 to each conduct a short pulse test (blocks 620, 630). The modules 510 perform the command test and report resulting values for the discharge pulse resistance and/or current and voltage values needed to needed to compute discharge pulse resistance to the cabinet controller 520 (block 640). Such data may be logged locally by the cabinet controller 520, which may accumulate data from a series of such tests and use the data to perform trend analyses that may predict, for example, battery useful life. Data may also be transferred to the UPS controller 32 or other recipient device for such analyses.

Figure 7:
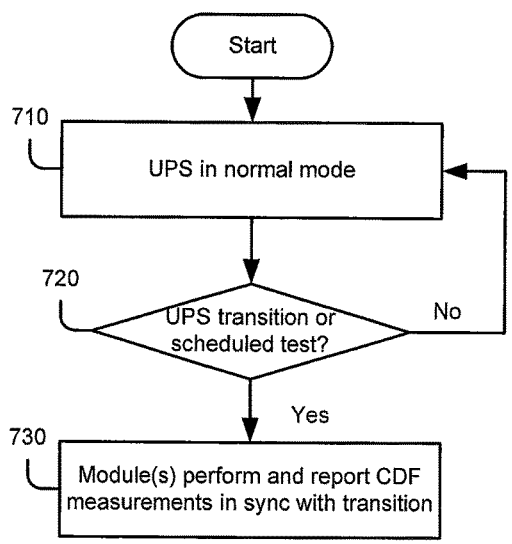

As noted above, discharge pulse resistance may be used in conjunction with CDF parameters to perform such analyses. As shown in FIG. 7, CDF data may be also be generated by the apparatus of FIG. 5. While operating in a normal mode, the UPS controller 32 may detect a need to transition to battery power because of, for example, a failure of a primary power source or a need to perform a scheduled battery test (block 720). The UPS controller 32 may indicate the timing of the transition to the cabinet controller 520, which may responsively command the modules 510 to collect and report CDF data (block 730). It will be appreciated that generation of CDF data may be accomplished in any of a number of different ways. For example, the modules 510 may continuously sample battery voltage at a rate sufficient to discriminate CDF features such as dip voltage and plateau voltage. These voltage samples may be, for example, time-stamped in relation to a reference clock, and the modules 510 and/or the cabinet controller 520 may log these voltage samples to allow subsequent correlation with a load transition event associated with occurrence of CDF behavior. The modules 510 and/or the cabinet controller 520 may process voltage samples associated with a CDF event to extract CDF parameters, such as dip voltage and plateau voltage. The cabinet controller 520 and/or the UPS controller 32 may log these CDF parameters and for use in battery state of health or other analyses. In some embodiments, CDF parameter may be generated on demand, e.g., once informed by the UPS controller 32 that a transition to battery power is impending, the cabinet controller 520 may command the modules 510 to commence voltage sampling to support extraction of CDF information. This sampling may, for example, be at a higher rate than sampling used for regular voltage monitoring of the batteries 10.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:
1. A method comprising:
   determining an open-circuit first voltage of a battery;
   increasing a loading of the battery for a load interval after determining the first voltage;
   determining a current through the battery during the load interval;
   determining an open-circuit second voltage of the battery after termination of the load interval; and
   determining a status of the battery from the determined first and second voltages and the determined current.

2. The method of claim 1, wherein determining a status of the battery from the determined first and second voltages and the determined current comprises determining a resistance of the battery from the determined first and second voltages and the determined current.

3. The method of claim 2, wherein determining a resistance of the battery from the determined first and second voltages and the determined current comprises a dividing a difference between the determined first and second voltages by the determined current.

4. The method of claim 1, wherein the battery is a valve-regulated lead acid (VRLA) battery and wherein the load interval comprises an interval of a discharge pulse sufficient to cause the battery to exit an equilibrium state.

5. The method of claim 4, wherein the discharge pulse is in a range from about 1 times the ampere-hour rating of the battery to about 15 times the ampere-hour rating of the battery.

6. A computer program product comprising computer program code embodied in a non-transitory computer-readable medium and configured to be executed on a data processing apparatus to perform the method of claim 1.

7. An apparatus comprising:
   an input port configured to be coupled to a battery;
   a load circuit coupled to the input port, configured to selectively couple a load to the input port; and
   a control circuit coupled to the input port and the load circuit and configured to couple the load to the input for a load interval, to determine open-circuit first and second voltages at the input port before and after the load interval, to determine a current through the battery during the load interval, and to determine a status of the battery from the determined first and second voltages and the determined current.

8. The apparatus of claim 7, wherein the control circuit is configured to determine a resistance of the battery from the determined first and second voltages and the determined current by dividing a difference between the first and second voltages by the determined current.

9. The apparatus of claim 8, wherein the load circuit, a current sensor and the control circuit are combined in a battery monitoring module configured to communicate with an external controller and to operate the load circuit and provide information regarding the determined resistance to the external controller responsive to a control input from the external controller.

10. The apparatus of claim 8, wherein the control circuit is further configured to determine a Coup de Fouet characteristic of the battery.

11. The apparatus of claim 7:
wherein the load circuit comprises a switch configured to selectively couple and decouple first and second terminals of the input port responsive to a switch control signal; and
wherein the control circuit comprises:
a current sensor configured to be coupled in series with the input port;
a voltage sensor coupled in parallel with the input port;
an analog to digital converter (ADC) circuit coupled to the current sensor and the voltage sensor; and
a processor coupled to the ADC circuit and configured to generate the switch control signal.

12. The apparatus of claim 11, wherein the current sensor is coupled in series with the switch.

13. The apparatus of claim 11, wherein the voltage sensor comprises a voltage divider.

14. The apparatus of claim 13, wherein the control circuit further comprises a difference amplifier circuit having a first input coupled to the voltage divider, a second input coupled to a reference voltage source, and an output coupled to an input of the ADC circuit.

* * * * *